United States Patent
McCombs et al.

(10) Patent No.: US 8,837,226 B2
(45) Date of Patent: Sep. 16, 2014

(54) MEMORY INCLUDING A REDUCED LEAKAGE WORDLINE DRIVER

(75) Inventors: Edward M. McCombs, Austin, TX (US); Stephen C. Horne, Austin, TX (US); Alexander E. Runas, Austin, TX (US); Daniel C. Chow, Austin, TX (US)

(73) Assignee: Apple Inc., Cupertino, CA (US)

( * ) Notice: Subject to any disclaimer, the term of this patent is extended or adjusted under 35 U.S.C. 154(b) by 440 days.

(21) Appl. No.: 13/286,351

(22) Filed: Nov. 1, 2011

(65) Prior Publication Data

US 2013/0111130 A1    May 2, 2013

(51) Int. Cl.
*G11C 11/34* (2006.01)
*G11C 8/08* (2006.01)

(52) U.S. Cl.
CPC .......................................... *G11C 8/08* (2013.01)
USPC ................. 365/185.23; 365/230.06

(58) Field of Classification Search
CPC ......... G11C 8/08; G11C 16/08; G06F 1/3296
USPC .............. 365/185.23, 230.06, 189.07, 185.03
See application file for complete search history.

(56) References Cited

U.S. PATENT DOCUMENTS

| | | | | |
|---|---|---|---|---|
| 5,282,176 | A * | 1/1994 | Allen et al. | 365/230.06 |
| 5,668,758 | A * | 9/1997 | Yiu et al. | 365/185.23 |
| 5,751,653 | A | 5/1998 | Chung | |
| 5,956,286 | A * | 9/1999 | Lattimore et al. | 365/230.05 |
| 5,966,331 | A * | 10/1999 | Shiau et al. | 365/185.23 |
| 6,021,083 | A * | 2/2000 | Shiau et al. | 365/230.01 |
| 6,535,430 | B2 * | 3/2003 | Ogura et al. | 365/185.23 |
| 6,538,932 | B2 * | 3/2003 | Ellis et al. | 365/194 |
| 6,580,649 | B2 * | 6/2003 | Park | 365/189.07 |
| 6,621,745 | B1 * | 9/2003 | Manea | 365/185.23 |
| 7,046,572 | B2 * | 5/2006 | Hansen et al. | 365/229 |
| 7,055,007 | B2 | 5/2006 | Flautner | |
| 7,110,319 | B2 * | 9/2006 | Kim et al. | 365/230.06 |
| 7,139,205 | B1 * | 11/2006 | Goldman et al. | 365/203 |
| 7,218,153 | B2 | 5/2007 | Chen | |
| 7,417,916 | B2 * | 8/2008 | Kim et al. | 365/230.06 |
| 7,433,239 | B2 | 10/2008 | Nautiyal | |
| 7,460,430 | B2 * | 12/2008 | Kim et al. | 365/230.06 |
| 7,466,620 | B2 * | 12/2008 | Mohammad et al. | 365/230.06 |
| 7,593,259 | B2 * | 9/2009 | Kim | 365/185.03 |
| 7,693,002 | B2 * | 4/2010 | Lin | 365/230.06 |
| 7,693,004 | B2 * | 4/2010 | Tsukude | 365/230.06 |

(Continued)

OTHER PUBLICATIONS

Moradi et al. Multi-Level Wordline Driver for Low Power SRAMs in Nano-Scale CMOS Technology. IEEE. 2011.*

(Continued)

*Primary Examiner* — Matthew D Spittle
(74) *Attorney, Agent, or Firm* — Meyertons, Hood, Kivlin, Kowert & Goetzel, P.C.

(57) ABSTRACT

A memory includes a wordline driver having reduced leakage. The memory includes a storage array coupled to a first voltage supply, and a number of wordline driver units each including a driver inverter. During a low power mode, the voltage of the voltage supply coupled to the wordline circuit is reduced or removed, while the voltage of the voltage supply coupled to the storage array is kept at least at a retention voltage. In addition a p-type transistor is coupled between the array voltage supply and an input to the wordline driver inverter, thereby keeping the output of the wordline driver inverter at a low logic level to prevent inadvertent wordline firing.

21 Claims, 3 Drawing Sheets

(56) References Cited

U.S. PATENT DOCUMENTS

| | | | |
|---|---|---|---|
| 7,764,569 B2 * | 7/2010 | Chen | 365/230.06 |
| 7,876,612 B2 | 1/2011 | Parent | |
| 7,944,727 B2 * | 5/2011 | Kurjanowicz | 365/96 |
| 8,014,215 B2 * | 9/2011 | Lee et al. | 365/189.08 |
| 8,159,899 B2 * | 4/2012 | Bolandrina et al. | 365/230.06 |
| 8,320,210 B2 * | 11/2012 | Narayanaswamy et al. | 365/210.1 |
| 2008/0205184 A1 * | 8/2008 | Tsukude | 365/226 |
| 2013/0290753 A1 * | 10/2013 | Ramaraju et al. | 713/320 |

OTHER PUBLICATIONS

Wieckowski et al. A Portless SRAM Cell Using Stunted Wordline Drivers. IEEE. 2008.*

Chatterjee et al. Effectiveness and Scaling Trends of Leakage Control Techniques for Sub-130nm CMOS Technologies. ACM. 2003.*

* cited by examiner

_US 8,837,226 B2_

MEMORY INCLUDING A REDUCED LEAKAGE WORDLINE DRIVER

BACKGROUND

1. Technical Field

This disclosure relates to memories, and more particularly to wordline driver leakage reduction.

2. Description of the Related Art

Many memory arrays suffer from the effects of current leakage. Typically, aside from the array bit cells, the next largest leakage current contributors are the wordline drivers. Because each wordline driver may be used to drive several bit cells it typically incorporate a large p-type transistor in the final inverter driver stage.

There are conventional techniques to try to reduce the wordline driver leakage. While some of the techniques have provided some reduction in leakage current, they still suffer from drawbacks. For example, one conventional technique uses level shifters to reduce the voltage used to power the peripheral circuits around the wordline drivers. This technique does reduce the leakage current of some of the peripheral circuits, but does not adequately address the leakage problems of the wordline drivers themselves. In addition level shifters increase area. Other approaches may utilize an inverter stage in the wordline driver that may be disabled when not in use. However, using this conventional approach may allow the wordline to inadvertently float to a logic level that could potentially allow data to be corrupted in the bit cells of the array.

SUMMARY OF THE EMBODIMENTS

Various embodiments of a memory including a reduced wordline driver leakage are disclosed. Broadly speaking, a mechanism for reducing leakage current in the wordline driver circuit of a memory is contemplated. The wordline driver includes an inverter with a large p-type transistor. Thus during a low power mode, the voltage of the voltage supply coupled to the wordline circuit is reduced or removed, while the voltage of the voltage supply coupled to the storage array is kept at least at a retention voltage. In addition a p-type transistor is coupled between the array voltage supply and an input to the wordline driver inverter, thereby keeping the output of the wordline driver inverter at a low logic level to prevent inadvertent wordline firing.

In one embodiment, a memory includes a storage array coupled to a first voltage supply, and a number of wordline driver units. Each of the wordline driver units includes an inverter configured to provide a wordline signal to the storage array. The inverter is coupled to a second voltage supply. Each wordline driver unit also includes a p-type retention transistor coupled between the first voltage supply and an input to the inverter. A control unit may provide a control signal to the p-type transistor to provide a path from the first voltage supply to the input of the inverter. The control unit may also reduce the voltage of the second voltage supply during operation in a low power mode.

In one specific implementation, during operation in a low power mode the control unit may reduce the voltage of the second voltage supply to a predetermined voltage below a normal operating voltage. More particularly, the predetermined voltage may be substantially zero volts.

Figure 1:
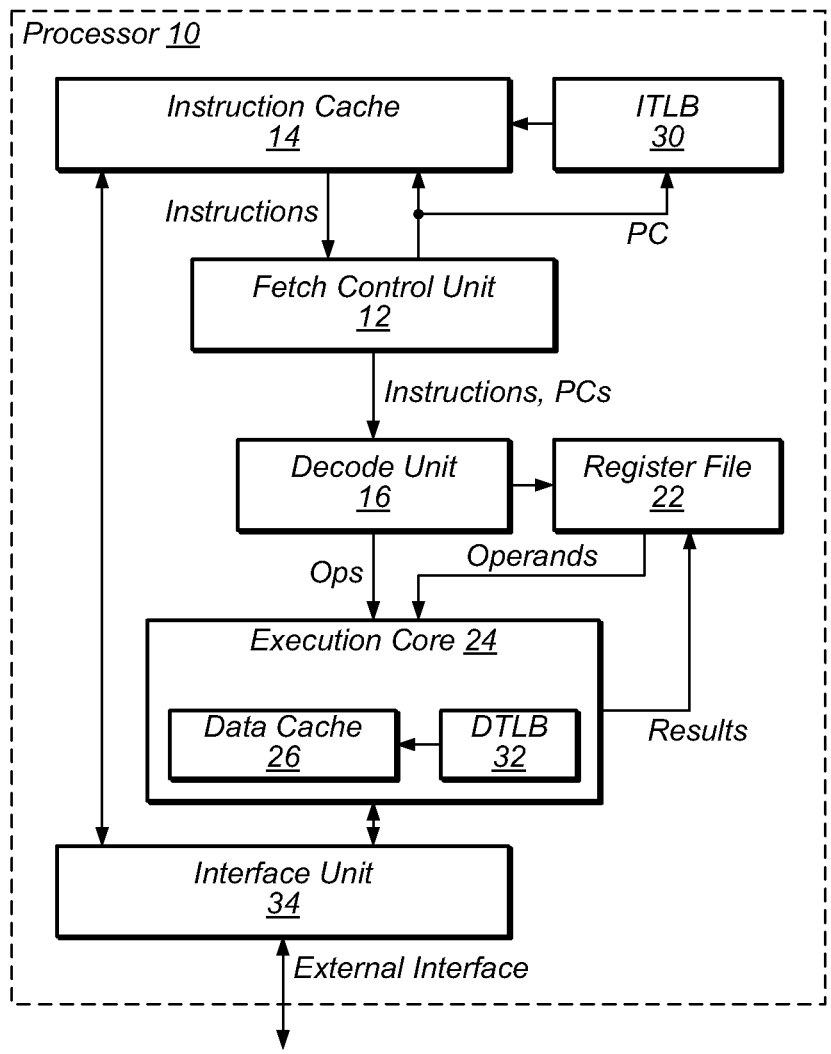
FIG. 1 is a block diagram of one embodiment of a processor.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a processor is shown. The processor 10 includes an instruction cache (ICache) 14 that is coupled to a fetch control unit 12. The processor also includes a decode unit 16 that is coupled to the fetch control unit 12 and to a register file 22, which is in turn coupled to an execution core 24. The execution core 24 is coupled to an interface unit 34, which may be coupled to an external interface of the processor 10, as desired.

In one embodiment, the fetch control unit 12 is configured to provide a program counter address (PC) for fetching from the instruction cache 14. The instruction cache 14 is configured to provide instructions (with PCs) back to the fetch control unit 12 to be fed into the decode unit 16. The decode unit 16 may generally be configured to decode the instructions into instruction operations (ops) and to provide the decoded ops to the execution core 24. The decode unit 16 may also provide decoded operands to the register file 22, which may provide operands to the execution core 24. The decode unit 16 may also be configured to schedule each instruction and provide the correct register values for execution core 24 to use.

The register file 22 may also receive results from execution core 24 that are to be written into the register file 22. Accordingly, the register file 22 may generally include any set of registers usable to store operands and results. Thus, the register file 22 may be implemented using a variety of storage types such as flip-flop type storages, random access memory (RAM), and the like.

The instruction cache 14 may include control logic and memory arrays. The memory arrays may be used to store the cached instructions to be executed by processor 10 and the associated cache tags. Instruction cache 14 may have any capacity and construction (e.g. direct mapped, set associative, fully associative, etc.). Instruction cache 14 may include any cache line size.

It is contemplated that the processor 10 may implement any suitable instruction set architecture (ISA), such as ARM™, PowerPC™, or x86 ISAs, combinations thereof, etc. In some embodiments, the processor 10 may implement an address translation scheme in which one or more virtual address spaces are made visible to executing software. Memory accesses within the virtual address space are translated to a physical address space corresponding to the actual physical memory available to the system, for example using a set of page tables, segments, or other virtual memory translation schemes. In embodiments that employ address translation, processor 10 may store a set of recent and/or frequently used virtual-to-physical address translations in a translation lookaside buffer (TLB), such as instruction TLB (ITLB) 30.

The execution core 24 may perform the various operations (e.g., MOV, ADD, SHIFT, LOAD, STORE, etc.) indicated by each instruction. In the illustrated embodiment, the execution core 24 includes data cache 26, which may be a cache memory for storing data to be processed by the processor 10. Like instruction cache 14, data cache 26 may have any suitable capacity, construction, or line size (e.g. direct mapped, set associative, fully associative, etc.). Moreover, data cache 26 may differ from the instruction cache 14 in any of these details. As with instruction cache 14, in some embodiments, data cache 26 may be partially or entirely addressed using physical address bits. Correspondingly, data TLB (DTLB) 32 may be provided to cache virtual-to-physical address translations for use in accessing data cache 26 in a manner similar to that described above with respect to ITLB 30. It is noted that although ITLB 30 and DTLB 32 may perform similar functions, in various embodiments they may be implemented differently. For example, they may store different numbers of translations and/or different translation information.

Interface unit 34 may generally include the circuitry for interfacing processor 10 to other devices on the external interface. The external interface may include any type of interconnect (e.g. bus, packet, etc.). The external interface may be an on-chip interconnect, if processor 10 is integrated with one or more other components (e.g. a system on a chip configuration). The external interface may be on off-chip interconnect to external circuitry, if processor 10 is not integrated with other components. In various embodiments, processor 10 may implement any instruction set architecture.

It is noted that each of the memories embedded within processor 10 (e.g., instruction cache 14, data cache 26, register file 22, etc.) may include wordline driver circuits to access their respective memory arrays. As described in greater detail below in conjunction with the description of FIG. 2, it may be possible to reduce the leakage current associated with the wordline drivers of the embedded memories of processor 10.

Figure 2:
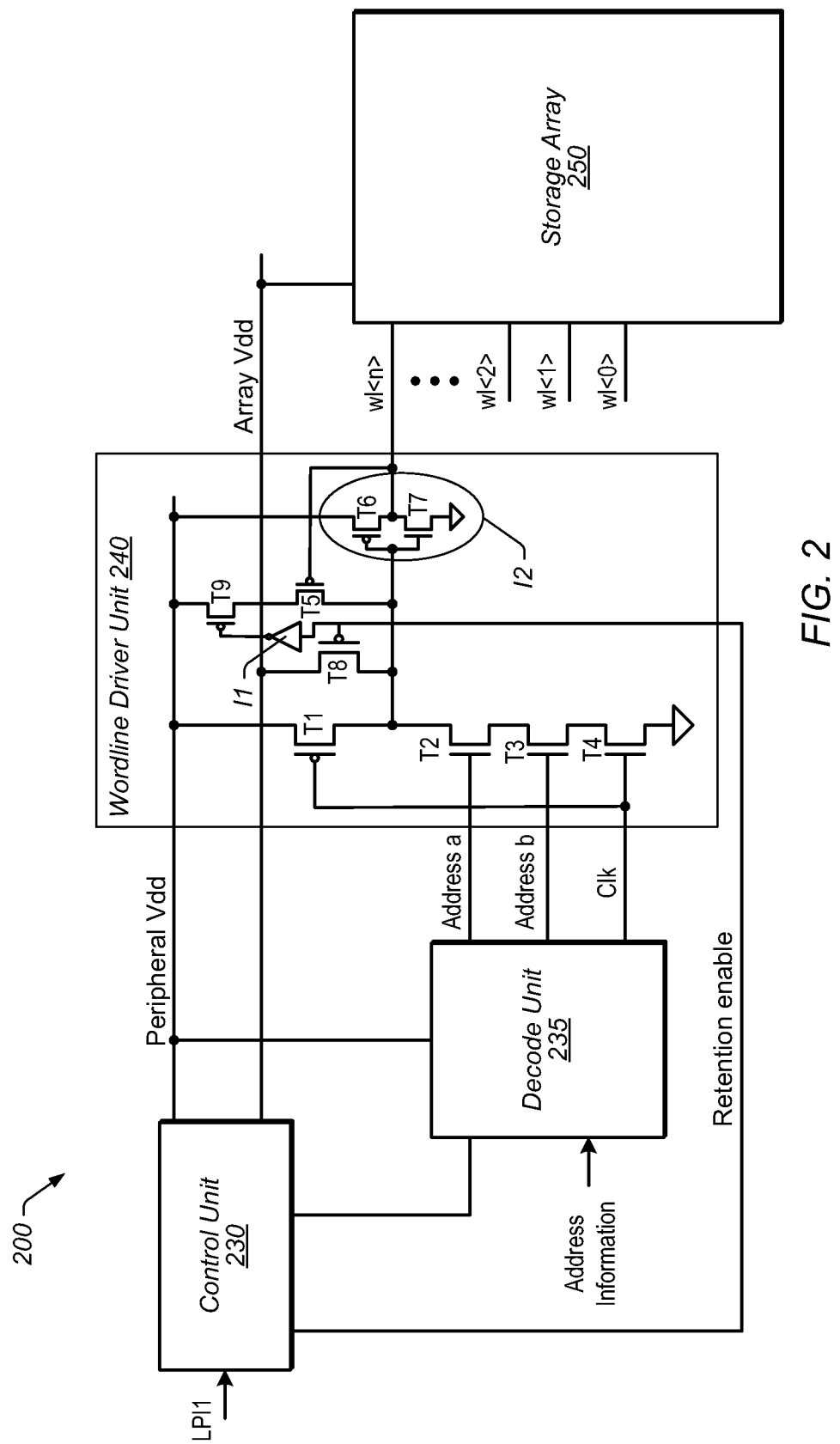
FIG. 2 is a block diagram of one embodiment of a portion of a memory including a mechanism to reduce wordline driver leakage.

Referring to FIG. 2, a block diagram of one embodiment of a portion of a memory including a mechanism to reduce wordline driver leakage is shown. The memory 200 of FIG. 2 includes a storage array 250 that is coupled to an array Vdd voltage supply and to several wordlines designated wl<0> through wl<n>. The memory 200 also includes a wordline driver unit 240 that is coupled to the storage array 250 via the wl<n> signal path. The wordline driver unit 240 is also coupled to a decode unit 235 via address lines 'a' and 'b' and a Clk signal, and to a peripheral Vdd voltage supply. The memory also includes a control unit 230 that is coupled to receive a low power indication (e.g., LP1), and to provide the peripheral Vdd and the array Vdd to the wordline driver 240 and the storage array 250, respectively. It is noted that although only one wordline driver unit 240 is shown, in other embodiments, there may be a separate wordline driver unit for each wordline coupled to the storage array 250. Alternatively, the wordline driver 240 may include additional circuitry to generate the additional wordlines wl<0> through wl<2>.

As shown, the decode unit 235 may provide the Clk signal, and the address a and b signals to the wordline driver unit 240. It is noted that the wordline driver unit 240 is implemented as a dynamic logic gate in the illustrated embodiment. In one embodiment, during normal operation of the memory 200, read and write access requests may be processed and the corresponding address information may be provided to the decode unit 235. When the Clk signal is at a logic value of zero, the p-type transistor T1 conducts and allows the input to the driver inverter I2 to be precharged to the peripheral Vdd voltage (referred to as the precharge state). The output of the inverter I2 would then be a logic value of zero, which corresponds to the wordline being off. In this state, the address lines a and b do not matter. In addition, the keeper transistor T5 is conducting due to the logic value of zero at the output of the inverter I2. The control unit 230 is configured to provide a retention enable signal at a logic value of one to turn off retention transistor T8, while turning on transistor T9. With transistors T5 and T9 both conducting, the logic value of one is reinforced at the input to the inverter I2.

However, when the Clk transitions to a logic value of one (referred to as the evaluate state), transistor T1 stops conducting, the transistor T4 conducts, and the inputs to transistors T2 and T3 are evaluated. The precharge voltage is weakly held at the input to the inverter I2 by transistors T5 and T9. If a read or write address corresponds to wordline wl<n>, then the address a and b signals would both be at a logic value of one, which turns on both transistors T2 and T3. This will allow the precharge voltage at the input of the inverter I2 to drain to circuit ground (and overcoming the pull up keeper transistors T5 and T9) through the n-stack including transistors T2, T3, and T4. This causes the output of the inverter I2 to transition to a logic value of one, thereby turning on the wordline wl<n>. If the operation is a read, any data in the bit cells (not shown) within the storage array 250 would be provided to the corresponding bit lines (also not shown). If the operation is a write, write data that is applied to the bit lines would be written into the corresponding bit cells. These precharge and evaluate cycles repeat as long as the Clk signal is active during normal operation.

As mentioned above, the wordline driver circuits may have a large leakage current. As shown in FIG. 2, much of this may be attributed to the typically large p-type transistor T6 of the inverter I2. During operation, current may leak through transistor T6 from the peripheral Vdd to circuit ground when there is a logic value of one at the input of the inverter I2. Thus, to reduce the leakage currents associated with the wordline driver unit 240 and the other wordline driver units that are coupled to the storage array 250, the peripheral Vdd may be reduced to zero volts or to some other predetermined voltage value that is less than the nominal operating voltage for the peripheral Vdd. Accordingly, as shown the storage array 250 is coupled to the array Vdd voltage supply and the wordline driver unit 240 and the decoder unit 235 are each coupled to the peripheral Vdd voltage supply so that the peripheral Vdd may be reduced independently of the array Vdd. In alternative embodiments, the decoder unit 235 may be coupled to a different Vdd source. Thus, as described further below, during inactivity of the storage array 250 or when the system is going into a low power mode, the voltage to the storage array 250 may be lowered to a voltage that will maintain data in the bit cells, but reduces power consumption, and the peripheral Vdd may be reduced or turned off entirely.

By reducing or turning off the peripheral Vdd, the leakage currents through the p-type transistors in the driver inverter I2 will be reduced, as well as the power consumption savings of turning off the remaining circuits connected to the peripheral Vdd. However, if the peripheral Vdd voltage is simply turned off, it could be possible for the wl<0> signal to float or go to an undesirable logic level. Accordingly, during the retention or low power mode of operation, the retention transistor T8 may be turned on by the retention enable signal provided by the control unit 230. The retention transistor T8 may provide the array Vdd to the input of the inverter I2 thereby clamping the wordline output of the inverter I2 to a logic value of zero and preventing inadvertent wordline fluctuations.

In addition, to prevent any sneak paths from the array Vdd to the peripheral Vdd while in the retention or low power mode, the retention enable signal also turns off the transistor T9 through the inverter I1. This blocks the array Vdd voltage at the input of the inverter I2 from "sneaking" back to the peripheral Vdd bus. Similarly, to prevent a sneak path through transistor T1, the decode unit 235 may be configured to drive the Clk signal to a logic value of one and at least one of the address a and b signals to a logic value of zero during the retention or low power mode. Doing so turns off transistor T1, thereby blocking a possible sneak path, and preventing a path through transistors T2 and T3 to circuit ground. In an alternative embodiment, another p-type transistor could be added in series between transistor T1 and the peripheral Vdd, similar to the transistor T9, and controlled by the same inverted retention enable signal.

In one embodiment, the control unit 230 may be configured to receive a low power mode indication from logic external to the memory 200. For example, a power management unit, or the like, may send the low power mode indication (e.g., LPI1) in preparation for entering the processor or the system into a low power mode. In response to receiving the low power mode indication, the control unit 230 may perform one or more of the following operations to enter into the low power mode: notify the decode unit 235 and reduce or remove the peripheral Vdd, assert the retention enable signal, and reduce the array Vdd. In response to being notified, the decode unit 235 may freeze the Clk signal to a logic value of one and drive at least one of the address a or address b signals to a logic value of zero.

In another embodiment, the control unit 230 may monitor the utilization of the memory 200 using any of a variety of methods. If the control unit 230 determines that the memory 200 is not being used, the control unit may perform the above operations to enter the low power mode.

It is noted that in the embodiment shown in FIG. 2, the memory 200 may correspond to any of the embedded memories such as the register file 22, instruction cache 14, and data cache 26 of FIG. 1. However, it is contemplated that in other embodiments, the memory 200 may be any type of memory that uses wordline drivers.

Figure 3:
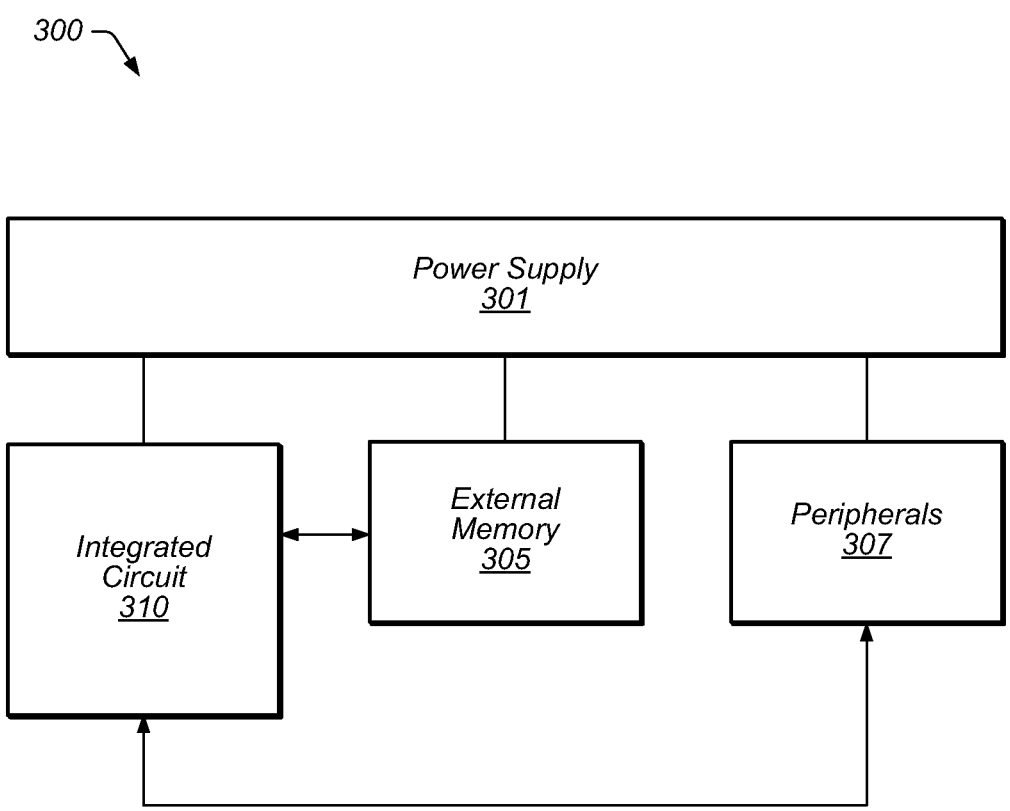
FIG. 3 is a block diagram of one embodiment of a system.

Turning to FIG. 3, a block diagram of one embodiment of a system is shown. The system 300 includes at least one instance of an integrated circuit 310 coupled to one or more peripherals 307 and an external system memory 305. The system 300 also includes a power supply 301 that may provide one or more supply voltages to the integrated circuit 310 as well as one or more supply voltages to the memory 305 and/or the peripherals 307.

In one embodiment, the integrated circuit 310 be a system on a chip (SOC) including one or more instances of a processor and various other circuitry such as a memory controller, video and/or audio processing circuitry, on-chip peripherals and/or peripheral interfaces to couple to off-chip peripherals, etc. More particularly, the integrated circuit 310 may include one or more instances of a processor such as processor 10 from FIG. 1. As such, the integrated circuit 310 may include one or more instances of an embedded memory such as memory 200 of FIG. 2. Accordingly, embodiments that include the memory 200 include the wordline driver leakage reduction mechanism described above in conjunction with the description of FIG. 2.

The peripherals 307 may include any desired circuitry, depending on the type of system. For example, in one embodiment, the system 300 may be included in a mobile device (e.g., personal digital assistant (PDA), smart phone, etc.) and the peripherals 307 may include devices for various types of wireless communication, such as WiFi, Bluetooth, cellular, global positioning system, etc. The peripherals 307 may also include additional storage, including various types of RAM storage, solid-state storage, or disk storage. As such, the peripherals 307 may also include RAM that includes the wordline driver leakage reduction mechanism described above. The peripherals 307 may include user interface devices such as a display screen, including touch display screens or multitouch display screens, keyboard or other input devices, microphones, speakers, etc. In other embodiments, the system 300 may be included in any type of computing system (e.g. desktop personal computer, laptop, workstation, net top etc.).

The external system memory 305 may be representative of any type of memory. For example, the external memory 305 may be in the DRAM family such as synchronous DRAM (SDRAM), double data rate (DDR, DDR2, DDR3, etc.), or any low power version thereof. However, external memory 305 may also be implemented in SDRAM, static RAM (SRAM), or other types of RAM, etc. Accordingly, external system memory 305 may also include the wordline driver leakage reduction mechanism described above in conjunction with the description of FIG. 2.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory comprising:
a storage array coupled to a first voltage supply;
a plurality of wordline driver units, each including an inverter configured to provide a wordline signal to the storage array, wherein the inverter is coupled to a second voltage supply;
wherein each inverter includes a p-type transistor coupled to an n-type transistor, wherein the input to the inverter is coupled to a gate terminal of each of the n-type and the p-type transistors, and an output of the inverter is a node between the n-type and the p-type transistors;
wherein each wordline driver unit includes a p-type retention transistor coupled between the first voltage supply and the input to the inverter; and
a control unit coupled to the plurality of wordline driver units and to the storage array, wherein the control unit is configured to provide a control signal to the p-type transistor to provide a path from the first voltage supply to the input of the inverter, and to reduce a voltage of the second voltage supply during operation in a low power mode.

2. The memory as recited in claim 1, wherein the control unit is configured to reduce the voltage of the second voltage supply to substantially zero volts during operation in the low power mode.

3. The memory as recited in claim 1, wherein during operation in the low power mode, the control unit is configured to reduce the voltage of the second voltage supply to a predetermined voltage below a normal operating voltage.

4. The memory as recited in claim 1, wherein in response to the p-type retention transistor providing the first voltage to the input of the inverter, the n-type transistor is configured to provide a path from a circuit ground reference to the wordline signal.

5. The memory as recited in claim 1, wherein the control unit is configured to operate in the low power mode in response to detecting inactivity of the storage array.

6. The memory as recited in claim 1, wherein the control unit is configured to operate in the low power mode in response to receiving a system low power indication.

7. The memory as recited in claim 1, wherein the wordline driver unit further includes a dynamic logic gate that includes a p-type precharge transistor coupled to the second voltage supply and to the input of the inverter.

8. A memory comprising:
a storage array coupled to a first voltage supply;
a plurality of wordline driver units coupled to the storage array, wherein each of the plurality of wordline driver units includes an inverter that is coupled to a second voltage supply and a p-type retention transistor coupled between the first voltage supply and an input to the inverter;
wherein each inverter includes a p-type transistor coupled to an n-type transistor, wherein the input to the inverter is coupled to a gate terminal of each of the n-type and the p-type transistors, and an output of the inverter is a node between the n-type and the p-type transistors; and
a control unit coupled to the plurality of wordline driver units and to the storage array, wherein during operation in a first mode the control unit is configured to:
provide a voltage of the second voltage supply to at least one of the wordline driver units; and
provide a control signal to turn off the p-type retention transistor;
wherein during operation in a second mode, the control unit is configured to:
reduce the voltage of the second voltage supply; and
provide the control signal to turn on the p-type transistor to provide a path from the first voltage supply to the input of the inverter.

9. The memory as recited in claim 8, wherein during operation in the first mode, each of the plurality of wordline driver units is configured to selectively provide a wordline signal to the storage array dependent upon received address information.

10. The memory as recited in claim 8, wherein the control unit is configured to reduce the voltage of the second voltage supply to substantially zero volts in response to receiving a low power indication.

11. The memory as recited in claim 10, wherein during operation in the second mode, the n-type transistor is configured to provide a path from a circuit ground reference to the wordline signal in response to the p-type retention transistor providing the first voltage to the input of the inverter.

12. A system comprising:
a memory; and
one or more processors coupled to the memory, wherein at least one of the one or more processors includes an embedded memory;
wherein the embedded memory includes:
a storage array coupled to a first voltage supply;
a plurality of wordline driver units, each including an inverter configured to provide a wordline signal to the storage array, wherein the inverter is coupled to a second voltage supply;
wherein each inverter includes a p-type transistor coupled to an n-type transistor, wherein the input to the inverter is coupled to a gate terminal of each of the n-type and the p-type transistors, and an output of the inverter is a node between the n-type and the p-type transistors;
wherein each wordline driver unit includes a p-type retention transistor coupled between the first voltage supply and the input to the inverter; and
a control unit coupled to the plurality of wordline driver units and to the storage array, wherein the control unit is configured to provide a control signal to the p-type transistor to provide a path from the first voltage supply to the input of the inverter, and to reduce a voltage of the second voltage supply during operation in a low power mode.

13. The system as recited in claim 12, wherein the embedded memory comprises a register file.

14. The system as recited in claim 12, wherein the embedded memory comprises a cache memory.

15. The system as recited in claim 12, wherein the control unit is configured to reduce the voltage of the second voltage supply to a predetermined voltage that is below a normal operating voltage in response to receiving a low power indication.

16. A method comprising:
a storage array of a memory operating at a first voltage provided by a first voltage supply;
during operation in a first mode:
a plurality of wordline driver units each including an inverter operating at a second voltage provided by a second voltage supply; and
a p-type retention transistor operating in a cut off mode;
during operation in a second mode:
reducing the second voltage; and
causing the p-type transistor to conduct thereby providing the first voltage to the input of the inverter.

17. The method as recited in claim 16, further comprising reducing the second voltage to a predetermined voltage that is below a normal operating voltage.

18. The method as recited in claim 16, further comprising operating in the second mode in response to detecting inactivity in the memory.

19. A mobile communication device comprising:
a memory; and
a processor coupled to the memory, wherein the processor includes an embedded memory including:
a storage array coupled to a first voltage supply;
a plurality of wordline driver units, each including an inverter configured to provide a wordline signal to the storage array during operation in a normal mode, wherein the inverter is coupled to a second voltage supply;
wherein each inverter includes a p-type transistor coupled to an n-type transistor, wherein the input to the inverter is coupled to a gate terminal of each of the n-type and the p-type transistors, and an output of the inverter is a node between the n-type and the p-type transistors;
wherein each wordline driver unit includes a p-type retention transistor coupled between the first voltage supply and the input to the inverter; and
a control unit coupled to the plurality of wordline driver units and to the storage array, wherein the control unit is configured to provide a control signal to the p-type transistor to provide a path from the first voltage supply to the input of the inverter, and to reduce a voltage of the second voltage supply during operation in a low power mode.

20. The mobile communication device as recited in claim 19, wherein the control unit is configured to detect inactivity in the embedded memory and to responsively reduce the voltage of the second voltage supply and provide the control signal to the p-type transistor.

21. The mobile communication device as recited in claim 19, wherein the control unit is configured to reduce the voltage of the second voltage supply to a predetermined voltage that is below an operating voltage during operation in the normal mode.

* * * * *